United States Patent [19]

Chang

[11] 4,236,224
[45] Nov. 25, 1980

[54] LOW ROUNDOFF NOISE DIGITAL FILTER

[75] Inventor: Tien-Lin Chang, Orange, Calif.

[73] Assignee: Rockwell International Corporation, El Segundo, Calif.

[21] Appl. No.: 973,543

[22] Filed: Dec. 26, 1978

[51] Int. Cl.³ .................................................. G06F 15/31
[52] U.S. Cl. .................................... 364/724; 364/745
[58] Field of Search .............................. 364/724, 745

[56] References Cited

U.S. PATENT DOCUMENTS

| 3,749,895 | 7/1973 | Kao | 364/745 |
| 3,906,199 | 9/1975 | Kieburtz et al. | 364/745 |
| 3,997,770 | 12/1976 | Claasen et al. | 364/724 |
| 4,034,196 | 7/1977 | Butterweck et al. | 364/745 |

OTHER PUBLICATIONS

Parker et al. "Limit-Cycle Oscillations in Digital Filters", *IEEE Trans. on Circuit Theory*, vol. CT-18, No. 6, Nov. 1971, pp. 687-697.

*Primary Examiner*—David H. Malzahn
*Attorney, Agent, or Firm*—H. Fredrick Hamann; Rolf M. Pitts; Edward A. Sokolski

[57] ABSTRACT

An error feedback circuit is employed in a digital filter to significantly lower noise in the output by feeding back the least significant (roundoff) output bits of the quantizer rather than throwing these bits away as is done in the prior art. The feedback circuit for accomplishing this end result includes a digital delay circuit which receives the roundoff bits and delays these bits for a sampling sequence ($Z^{-1}$) (as is also done for the rounded bits), a multiplier which multiplies the output of the delay circuit by a predetermined integer and an adder which subtracts the output of the multiplier from the delayed filtered digital output signal which has been multiplied by a predetermined constant.

5 Claims, 7 Drawing Figures

LOW ROUNDOFF NOISE DIGITAL FILTER

The invention herein described was made in the course of or under a contract or subcontract thereunder with the Federal Bureau of Investigation.

BACKGROUND OF THE INVENTION

1. Field of the Invention

This invention relates to digital filters and more particularly to such a filter in which the least significant (roundoff) bits of the quantizer are fed back for summation with the rounded bits to minimize roundoff noise.

2. Description of the Prior Art

The basic elements in the implementation of a digital filter are shown in FIG. 1 and comprise an adder 11, a unit delay circuit 12 which stores the value of a previous sampling sequence, a multiplier 13 to multiply the value of the previous sequence by a constant "a", and a quantizer 14 which quantizes the output of multiplier 13 and provides the quantized signal to adder 11 for summation with the digital input signal "u(n)" to be filtered. In this prior art filter, in view of the computational limitations of the computer circuitry, the least significant bits in the quantizer output (referred to as "roundoff" bits) are thrown away, the remaining bits which are utilized in the computation being referred to as "rounded" bits. This produces a significant error or "noise" in the output which significantly lessens the accuracy of the computation, particularly in situations where multiplications are performed on the signals thus compounding the errors. While this problem has been recognized for many years (see, for example, the discussing starting at the bottom of page 107 of "Digital Processing of Signals" by Gold and Rader, published by McGraw and Hill in 1969), no successful solution has been provided in the prior art. In addition to the aforementioned book by Gold and Rader, the following books on digital signal processing are pertinent for providing background information for the present application: "Theory and Application of Digital Signal Processing" by Rabiner and Gold, published by Prentiss-Hall Inc., 1975, and "Digital Signal Processing" by Oppenheim and Schafer, published by Prentiss-Hall Inc., 1975. The following United States patents on digital filters are also of interest for providing background information: U.S. Pat. No. 3,997,770 to Claasen et al; U.S. Pat. No. 4,034,196 to Butterweck et al; and U.S. Pat. No. 3,792,356 to Kobayashi et al.

SUMMARY OF THE INVENTION

The present invention provides a significant improvement over prior art digital filters by minimizing errors and noise associated therewith due to roundoff in quantization. Rather than throwing away the least significant bits of the quantizer, as is done in the prior art, the circuitry of the present invention feeds these least significant bits back so that they are subtracted from the information represented by the rounded bits, thereby making for an output signal having reduced noise and a substantially reduced noise variance with different multiplication factors (a) for the delayed rounded signals.

It is therefore an object of my invention is to lower the noise in the output of a digital filter by retaining the least significant bits of the quantizer in the generation of the output signal.

It is another object of my invention to provide means for generating a unique error feedback signal for minimizing roundoff errors and output noise variance in a digital filter.

Other objects of this invention will become apparent as the description proceeds in connection with the accompany drawings.

DESCRIPTION OF THE PREFERRED EMBODIMENT

Figure 2:
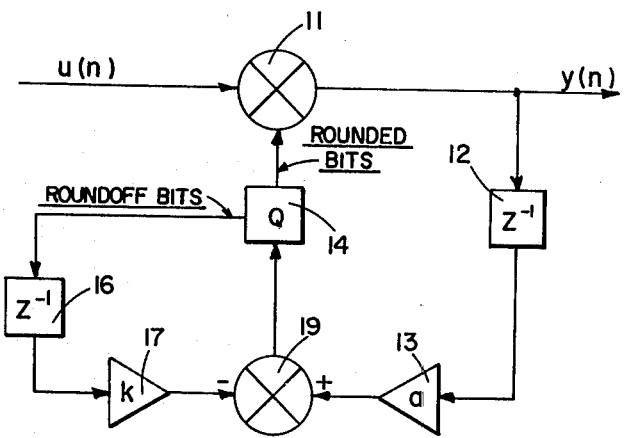
FIG. 2 is a schematic drawing illustrating a first embodiment of my invention.

Referring now to FIG. 2, a first embodiment of my invention is schematically illustrated. The digital input signal u(n) is fed to summing device 11 where it is summed with the rounded bit output (for the preceding sampling sequence) of quantizer 14. This preceding sequence signal is generated by means of delay or storage device ($Z^{-1}$) 12, the delayed signal being multiplied by a factor "a" in multiplier 13. The "roundoff" (least significant) bits of the quantizer 14, which in the prior art are thrown away, are delayed one sampling sequence in delay device 16, the output of the delay device being multiplied by an integer (k) in multiplier 17. The output of multiplier 17 is fed to summing device 19 where it is subtracted from the output of multiplier 13. The output of summing device 19 which represents both the rounded and roundoff bits is fed to quantizer 14 as the input thereto. The output of the quantizer thus represents the preceding (delayed) sampling sequence and includes information representing both the roundoff and rounded bits.

The present output y(n+1) of the first order digital filter of FIG. 2 can be defined as follows:

$$y(n+1) = x(n+1) + e(n+1) + u(n+1) \qquad (1)$$

where x(n+1) is the output of summing device 19, u(n+1) is the present input to the digital filter, and e(n+1) is the roundoff error remaining.

The multiplication factor "k" of multiplier 17 is an integer and should be chosen such that absolute value of a−k is smaller than absolute value of a. This means that to satisfy the above requirement that k must be either 1 or 0, and k is the nearest integer of a.

Figure 2A:
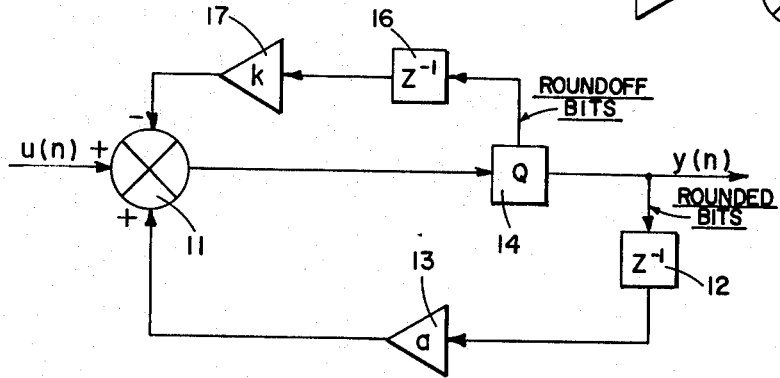
FIG. 2A is a schematic drawing illustrating a variation of the first embodiment.

Referring now to FIG. 2A, a variation in the implementation of the first embodiment is illustrated. In this variation of design, a single summing device 11 is employed to perform all of the summing functions, the quantizer 14 being placed in the output line rather than in the feedback loop. The operation is basically the same as that of the first described implementation with a signal representing the delayed roundoff bits being subtracted from the signal representing the delayed rounded bits.

Figure 1:
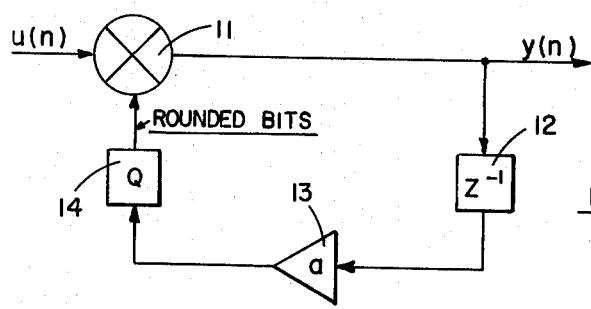
FIG. 1 is a schematic drawing illustrating a prior art first order digital filter.
Figure 3:
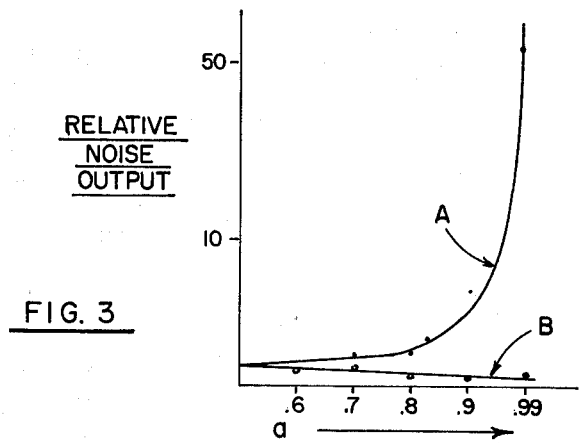
FIG. 3 is a graph illustrating the improvement achieved by my invention over the prior art.

Referring now to FIG. 3, the improvement achieved by the present invention over the prior art is graphically illustrated. The graph line "A" represents the relative noise output for various values of the multiplier "a" for the canonical form digital filter illustrated in FIG. 1 while the graph line "B" represents the relative noise output for various values of "a" for the present invention. Thus it can be seen that not only is lower noise output obtained in the present invention, but output noise variances with changes in "a" are greatly reduced.

Figure 4:
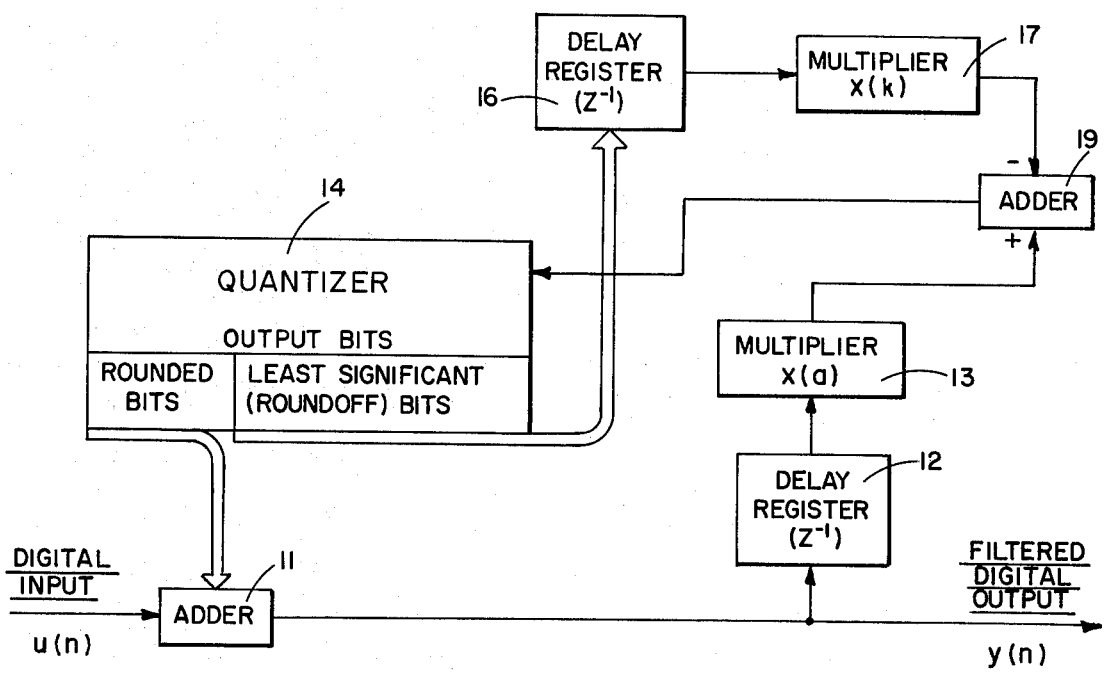
FIG. 4 is a schematic drawing showing hardware components which may be employed in the implementation of the first embodiment of my invention.

Referring now to FIG. 4, the first embodiment of the invention is shown in "hardware" form. The digital input signal "u" to be digitized is fed to adder 11. Also fed to adder 11 is the rounded bit output of quantizer 14, the "rounded" bits including all of the bits except predetermined least significant bits. The least significant (roundoff) bit output of quantizer 14 is fed to delay register 16 which delays these bits for a period equal to one sampling sequence of quantizer operation ($Z^{-1}$). The output of delay register 16 is multiplied by a predetermined integer (k) is multiplier 17, the output of the multiplier being fed to adder 19.

The output of adder 11 is delayed by one quantizer sequence ($Z^{-1}$) in delay register 12, the output of the delay register being fed to multiplier 13 where it is multiplied by a predetermined factor (a). The output of multiplier 13 is fed to adder 19 for summation with the output of multiplier 17, the output of adder 19 being fed to quantizer 14 as the input thereto. Thus, the input to the quantizer is a signal representing both the rounded and roundoff bits of the previous sequence of operation. Quantizer 14 may be any conventional quantizer, such as a rounding two's complement truncation or sign-magnitude truncation quantizer, as described starting on page 412 of the aforementioned book by Oppenheimer and Schafer.

Figure 5:
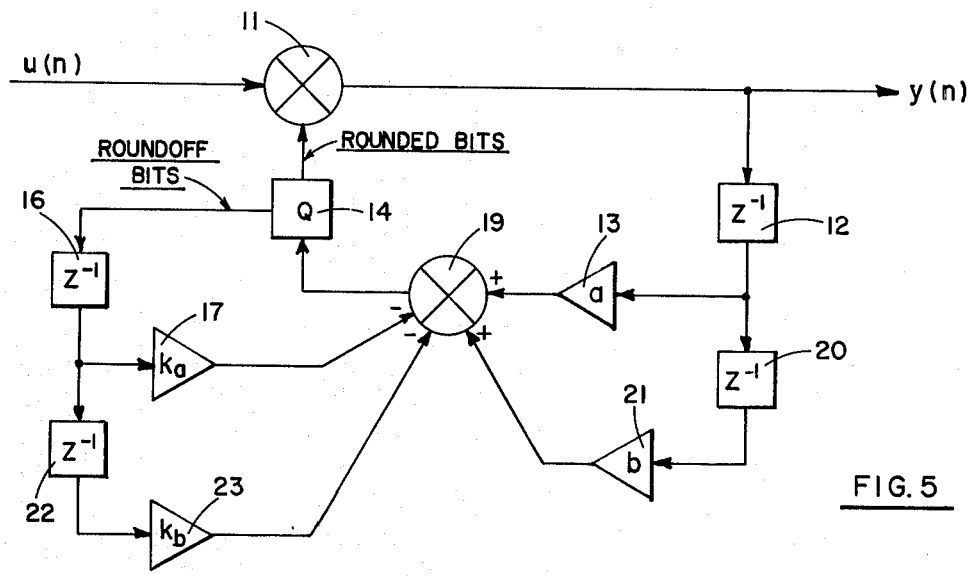
FIG. 5 is a schematic representation of a second embodiment of my invention involving a second order filter.

Referring to FIG. 5, a second embodiment of the invention is illustrated, this second embodiment involving a second order digital filter. This second order filter uses the same basic concept as the first order filter just described except that a second order delay is provided for the rounded bits and a second order delay is provided in the feedback loop for the roundoff bits, to achieve the second order implementation. Thus, in addition to the first delay loop between summing device 11 and summing device 19 a second delay loop including delay device 20 and multiplier 21 is provided. Multiplier 21 multiplies the output of the delay device 20 by a predetermined factor "b". Similarly, for the roundoff bits of quantizer 14, a second delay device 22 is provided which receives the output of first delay device 16 to provide delay for an additional sequence. The output of delay device 22 is multiplied by a predetermined integer "$k_b$" in multiplier 23, the output of multiplier 23 being fed to summing device 19. In a typical example, "a" is between 1.5 and 2, "b" is between $-1$ and 0.5, $k_a=2$ and $k_b=-1$.

Figure 6:
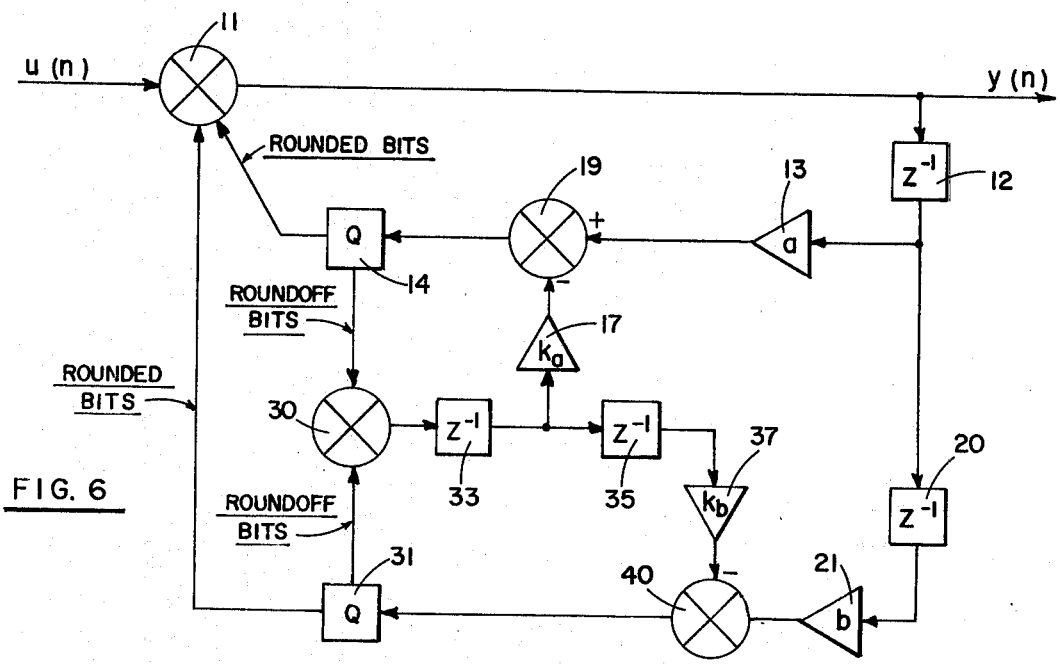
FIG. 6 is a schematic representation of a third embodiment of my invention involving a second order filter employing two quantizers.

Referring now to FIG. 6, a further embodiment of the invention is illustrated, this embodiment being a second order digital filter incorporating two quantizers. In this embodiment, the first sequence delay is achieved by means of delay device 12, this output being multiplied by factor "a" in multiplier 13 and fed to summing device 19, the output of which is fed to quantizer 14, as in the previous embodiment. A second sequence delay is achieved by means of delay device 20 the output of this delay device being multiplied by a factor "b" in multiplier 21 as for the previous embodiment.

The roundoff bit output of quantizer 14 is fed to summing device 30 where it is summed with the roundoff bit output of quantizer 31. The output of summing device 30 is fed to delay device 33, the output of delay device 33 being fed to multiplier 17 where it is multiplied by an integer, $k_a$ as the previous embodiment. The output of multiplier 17 which represents the first order roundoff bit output is fed to summing device 19 for subtraction from the first order output representing the rounded bits. The output of delay device 33 is fed to delay device 35 where an additional delay sequence is imparted to the signals. The output of delay device 35 is fed to multiplier 37 where it is multiplied by a predetermined integer, $k_b$. The output of multiplier 37 is fed to summing device 40 where it is subtracted from the second order output for the rounded bits and fed to quantizer 31. The output of quantizer 31 is fed to summing device 11 for summation with the first order signals received from quantizer 14.

It will be apparent to those skilled in the art that the same design principles described herein can be readily adapted to higher order and multi-dimensional digital filters.

While the invention has been described and illustrated in detail, it is to be clearly understood that this is intended by way of illustration only and is not to be taken by way of limitation, the spirit and scope of this invention being limited only by the terms of the following claims.

I claim:

1. In a digital filter for filtering a digital input signal, said digital filter having delay means for delaying an output signal thereof for the period of a predetermined signal sampling sequence, means for multiplying the output of said delaying means by a predetermined factor, quantizer means for quantizing a function of the output of said multiplying means, the output of said quantizer means including predetermined "rounded" bits and predetermined least significant "roundoff" bits, an improvement being means for feeding back a signal representing the "roundoff" bits for subtraction from a signal representing the "rounded" bits comprising:
   a delay device for delaying the "roundoff" bit output of said quantizer for a period equal to the period of said predetermined sequence,
   means for multiplying the output of said last mentioned delay device by a predetermined integer, and
   means interposed at the input of said quantizer for subtracting the output of said last mentioned multiplying means from the output of said first mentioned multiplying means, whereby the output of said subtracting means, which represents the difference between the rounded and roundoff bits for a previous sequence, is fed to the quantizer as the input signal thereto.

2. The filter of claim 1 wherein said filter is a second order filter and includes second delay means for delaying the output of the first mentioned delay means for an additional period equal to a second sampling sequence and means for multiplying the output of the second delay means by a second predetermined factor, the first and second delayed and multiplied signals being summed together, and wherein the improvement further includes:

a second delay device for delaying the output of the first mentioned delay device for a period equal to a second sampling sequence of operation, and means for multiplying the output of the second device by a second predetermined integer, and means for algebraically combining all said delayed and multiplied signals together, the output of said last mentioned summing means being fed to the quantizer as the input thereto.

3. In a digital filter for filtering a digital input signal, said filter having a quantizer with a predetermined least significant (roundoff) bit output and signficant (rounded) bit output wherein the rounded bit output is delayed, and multiplied by a predetermined factor, the improvement wherein the roundoff bits are delayed and fed back to provide a portion of the input to the quantizer comprising:

a delay device for delaying the roundoff bit output of the quantizer for a period equal to a sampling sequence of the digital input signal, multiplier means for multiplying the output of said delay device by a predetermined integer, and means for subtracting the output of said multiplier means from the delayed and multiplied rounded bit output, the output of the subtracting means being fed to the quantizer as the input thereto.

4. The digital filter of claim 3 wherein the delayed rounded bit output is multiplied by a factor "a" and the delayed roundoff bit output is multiplied by an integer "k" wherein $|a-k|$ is less than $|a|$.

5. A method for lowering the noise in the output of a digital filter having a quantizer, the method comprising the steps of:

delaying a digital output of the filter by a period equal to a digital sampling sequence, multiplying the delayed digital output by a predetermined factor (a), delaying the roundoff (least significant) bits in the output of the quantizer by a period equal to a digital sampling sequence of said digital filter, multiplying the delayed roundoff bits by a predetermined integer (k), subtracting said delayed and multiplied roundoff bits from the delayed and multiplied digital output, and feeding the difference of said subtraction as the input to the quantizer.

* * * * *